United States Patent
Ledbetter

(10) Patent No.: US 10,670,667 B2
(45) Date of Patent: Jun. 2, 2020

(54) WEARABLE PARTIAL DISCHARGE DETECTOR

(71) Applicant: Group CBS, Inc., Carrollton, TX (US)

(72) Inventor: Finley Lee Ledbetter, Argyle, TX (US)

(73) Assignee: GROUP CBS, INC., Carrollton, TX (US)

( * ) Notice: Subject to any disclaimer, the term of this patent is extended or adjusted under 35 U.S.C. 154(b) by 0 days.

(21) Appl. No.: 15/442,246

(22) Filed: Feb. 24, 2017

(65) Prior Publication Data

US 2017/0248644 A1 Aug. 31, 2017

Related U.S. Application Data

(60) Provisional application No. 62/299,918, filed on Feb. 25, 2016.

(51) Int. Cl.
*G01R 31/50* (2020.01)
*A41D 1/00* (2018.01)
(Continued)

(52) U.S. Cl.
CPC ............ *G01R 31/50* (2020.01); *A41D 1/002* (2013.01); *A42B 1/242* (2013.01); *A42B 1/245* (2013.01);
(Continued)

(58) Field of Classification Search
CPC ...... G01R 31/024; G01R 31/12; H01Q 1/273; A42B 1/242; A42B 1/245; A41D 1/002; A41D 13/008
See application file for complete search history.

(56) References Cited

U.S. PATENT DOCUMENTS

2002/0097157 A1 7/2002 Piri et al.
2006/0022882 A1* 2/2006 Gerder .................. H01Q 1/273
343/718

(Continued)

FOREIGN PATENT DOCUMENTS

CN 105158651 A 12/2015
JP 2012173089 A * 9/2012
(Continued)

OTHER PUBLICATIONS

International Search Report and Written Opinion in corresponding International Patent Application No. PCT/US2017/019421 dated May 29, 2017, 13 pages.

*Primary Examiner* — Akm Zakaria
(74) *Attorney, Agent, or Firm* — Foley & Lardner LLP

(57) ABSTRACT

Disclosed herein is a system for detecting a partial discharge from electrical equipment. The system includes a vest dimensioned for wear by a user. An antenna is associated with the vest, and a receiver is coupled to the antenna and associated with the vest. At least one indicator device is associated with the best. Circuitry is associated with the vest and coupled to the receiver. The circuitry is configured to monitor ambient radiofrequency energy in real time, and determine that the partial discharge has occurred as a function of the ambient radiofrequency energy. The circuitry actuates the at least one indicator device as a function of the determination that the partial discharge has occurred, and transmits the determination that the partial charge has occurred to a control station via the wireless transmitter.

23 Claims, 5 Drawing Sheets

(51) Int. Cl.
*A42B 1/24* (2006.01)
*G01R 31/12* (2020.01)
*H01Q 1/27* (2006.01)
*A41D 13/008* (2006.01)

(52) U.S. Cl.
CPC ............ *G01R 31/12* (2013.01); *H01Q 1/273* (2013.01); *A41D 13/008* (2013.01)

(56) References Cited

U.S. PATENT DOCUMENTS

| | | | | |
|---|---|---|---|---|
| 2007/0282561 | A1* | 12/2007 | Beckwith | G01V 3/12 |
| | | | | 702/127 |
| 2008/0027663 | A1* | 1/2008 | Anderson | G01R 31/1227 |
| | | | | 702/59 |
| 2014/0101831 | A1 | 4/2014 | Balzano | |
| 2014/0117927 | A1* | 5/2014 | Chateau | H04B 5/0075 |
| | | | | 320/108 |
| 2016/0161543 | A1* | 6/2016 | Andle | G01R 31/1272 |
| | | | | 324/551 |
| 2017/0196513 | A1* | 7/2017 | Longinotti-Buitoni | ................. |
| | | | | A61B 5/6804 |

FOREIGN PATENT DOCUMENTS

| | | |
|---|---|---|
| JP | 2012173089 A | 9/2012 |
| KP | 101303082 | 9/2013 |

\* cited by examiner

WEARABLE PARTIAL DISCHARGE DETECTOR

CROSS REFERENCE TO RELATED APPLICATIONS

This application claims the benefit of and priority to U.S. Provisional Patent Application No. 62/299,918, filed on Feb. 25, 2016, entitled, "Wearable Partial Discharge Detector," and is incorporated herein by reference in its entirety.

TECHNICAL FIELD

This disclosure is related to the field of safety equipment for technicians working around electrical equipment, and more particularly, to a wearable partial discharge detector.

BACKGROUND

In electronics, a partial discharge is a localized dielectric breakdown of a small portion of an electrical insulation system under a high voltage stress, which does not bridge the space between two conductors. Partial discharges within solid insulation systems are typically caused by a failure in the insulation system, for example due to dirt, contamination, or defects. Another common cause of partial discharges within solid insulation systems is the presence of voids within the insulation systems, which function as capacitors that discharge small amounts of energy to ground at a 60 Hz frequency.

In the field of high voltage, high current electrical system maintenance and repair, a full discharge (and thus an equipment failure) can be deadly to a nearby technician. Since partial discharges typically precede full discharges, a device capable of detecting partial discharges would be useful in the environments in which such technicians work.

Certain methods of detecting partial discharges are known. For example, it is known that partial discharges produce several signatures that can be used to characterize and locate issues. Some signatures that may be checked for in the field are the presence of a transient earth voltage, and a high frequency acoustic signal. By locating these signatures, technicians may locate and diagnose faults in the field, but detection of these signatures requires expensive, specialized equipment. In addition to being expensive, this equipment requires specialized training that technicians may not have.

Therefore, the development of new devices to detect partial discharge that are easy to use as well as relatively economical to produce is desirable.

SUMMARY

Disclosed herein is a system for detecting a partial discharge from electrical equipment. The system includes a vest dimensioned for wear by a user. An antenna is associated with the vest, and a receiver is coupled to the antenna and associated with the vest. At least one indicator device is associated with the vest. Circuitry is associated with the vest and coupled to the receiver. The circuitry is configured to monitor ambient radiofrequency energy in real time, and determine that the partial discharge has occurred as a function of the ambient radiofrequency energy. The circuitry actuates the at least one indicator device as a function of the determination that the partial discharge has occurred, and transmits the determination that the partial charge has occurred to a control station via the wireless transmitter.

The vest may have a collar, and the at least one indicator device may be a sound generation unit positioned adjacent the collar such that the user, or a person in proximity to the user, can hear sound generated by the sound generation unit.

The vest may have a proximal portion to be worn adjacent a head of the user, and a distal portion to be worn adjacent a waistline of the user. The at least one indicator device may have a light emitting diode array positioned adjacent the distal portion of the vest such that the user, or a person in proximity to the user, can see light emitted by the light emitting diode array.

The vest may have at least one internal compartment defined therein, and the receiver and/or at least one indicator device and/or circuitry may be disposed within the at least one internal compartment.

The vest may have at least one pocket defined therein, and the receiver and/or the at least one indicator device and/or the circuitry may be disposed within the at least one pocket.

Another aspect is directed to a wearable device for detecting a partial discharge from electrical equipment. The wearable device includes a wearable base for wearing on a human body, and an antenna carried by the wearable base. A receiver is coupled to the antenna and carried by the wearable base. At least one indicator device is carried by the wearable base. Circuitry is carried by the wearable base, and is coupled to the antenna, receiver, and at least one indicator device. The circuitry is configured to monitor ambient radiofrequency energy in real time, determine that the partial discharge has occurred as a function of the ambient radiofrequency energy, and actuate the at least one indicator device as a function of the determination that the partial discharge has occurred.

In some applications, the circuitry may be configured to determine that the partial discharge has occurred based on the ambient radiofrequency energy exceeding a predetermined threshold. The circuitry may be configured to determine that the partial discharge has occurred based on the ambient radiofrequency energy exceeding a predetermined threshold for a predetermined period of time.

The at least one indicator device may be at least one of a vibration motor, a speaker, an alarm, a piezoelectric speaker, and a light emitting diode array.

At least one input device may be carried by the wearable base, and the circuitry may be further configured to deactuate the at least one indicator device based on the at least one input device. In some cases, the circuitry may be configured to deactuate the at least one indictor device for a predetermined period of time based on the at least one input device.

The circuitry may include a signal processing unit coupled to the antenna and configured to generate a RF signal output as a function of the ambient radiofrequency energy. A controller may be coupled to the output of the signal processing unit and configured to determine whether the partial discharge has occurred as a function of the RF signal output, and actuate the at least one indictor as a function of the determination that the partial discharge has occurred.

A wireless transmitter may be carried by the wearable base and coupled to the circuitry, and the circuitry may be configured to transmit the determination that the partial charge has occurred to a control station via the wireless transmitter.

A global positioning satellite receiver may be carried by the wearable base and coupled to the circuitry. The circuitry may be configured to transmit a location of the global positioning satellite receiver when the determination that the partial charge has occurred to the control station via the wireless transmitter.

The circuitry may be configured to monitor ambient ultra high frequency (UHF) radiofrequency energy in real time and to determine that the partial discharge has occurred as a function of the ambient UHF radiofrequency energy.

The circuitry may be configured to monitor ambient extremely low frequency (ELF) radiofrequency energy in real time and to determine that the partial discharge has occurred as a function of the ambient ELF radiofrequency energy.

The circuitry may be configured to count a number of partial discharges that have occurred as a function of the ambient radiofrequency energy and configured to actuate the at least one indicator device as a function of the number of partial discharges that have occurred.

The wearable base may be a garment, which may be dimensioned to be wearable on an upper body or a lower body of the human body.

The garment may be a vest, shirt, pants, belt, jacket, flash suit, sash, hat, helmet, necklace, wristband, or other wearable garment.

A further aspect is directed to a system for detecting a partial discharge from electrical equipment. The system may include a wearable device for wearing on a human body. The wearable device may include a wearable base, with an antenna carried by the wearable base and a receiver coupled to the antenna and carried by the wearable base. A wireless transmitter is carried by the wearable bas, and at least one indicator device is also carried by the wearable base. Circuitry carried by the wearable base, coupled to the receiver, wireless transmitter, and at least one indicator, and configured to monitor ambient radiofrequency energy in real time, determine that the partial discharge has occurred as a function of the ambient radiofrequency energy, actuate the at least one indicator device as a function of the determination that the partial discharge has occurred, and transmit the determination that the partial charge has occurred via the wireless transmitter. A control station is configured to receive the determination that the partial discharge has occurred and to perform at least one function based thereupon.

The at least one function may be storing the determination that the partial discharge has occurred or presenting output to a user that the partial discharge has occurred.

DETAILED DESCRIPTION

In the following detailed description and the attached drawings and appendices, numerous specific details are set forth to provide a thorough understanding of the present disclosure. However, those skilled in the art will appreciate that the present disclosure may be practiced, in some instances, without such specific details. In other instances, well-known elements have been illustrated in schematic or block diagram form in order not to obscure the present disclosure in unnecessary detail. Additionally, for the most part, specific details, and the like, have been omitted inasmuch as such details are not considered necessary to obtain a complete understanding of the present disclosure, and are considered to be within the understanding of persons of ordinary skill in the relevant art.

Figure 1:
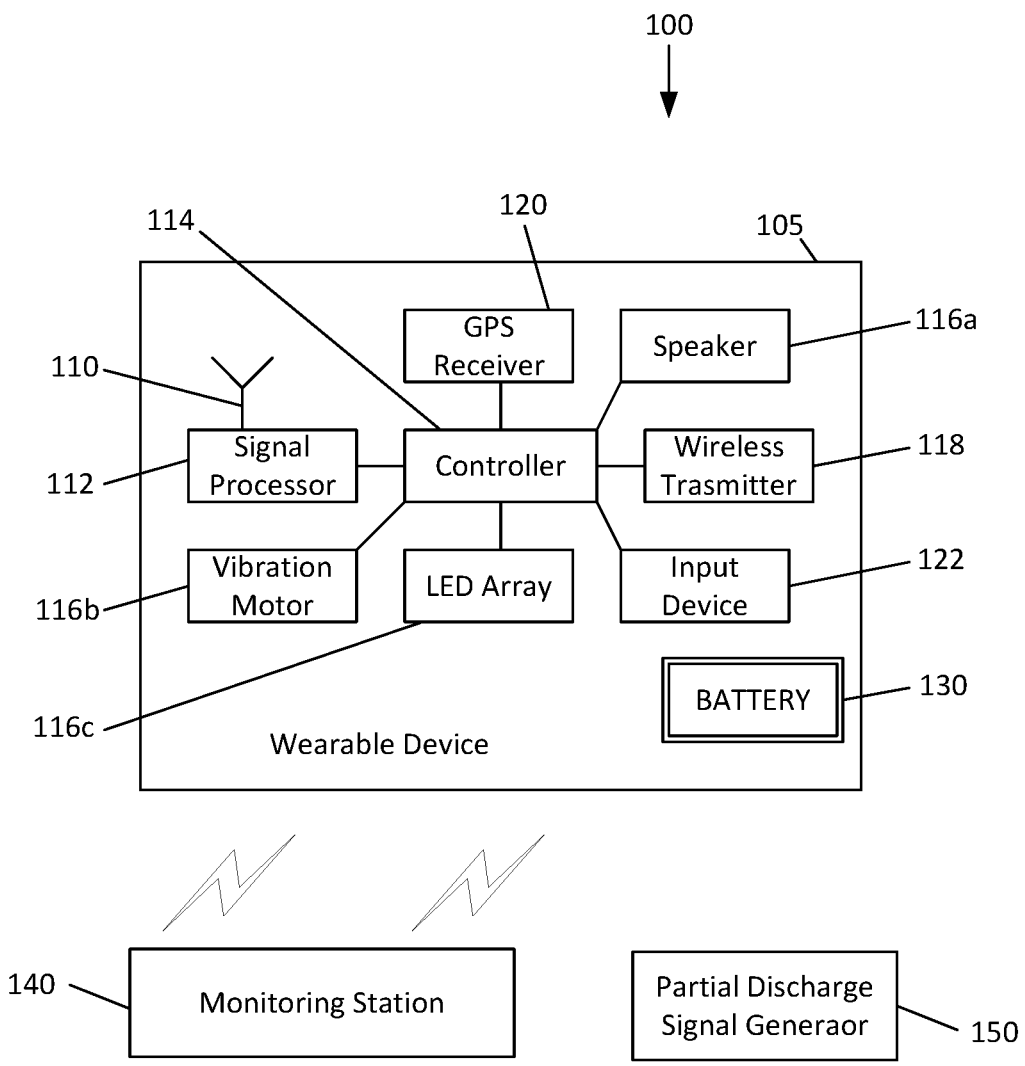
FIG. 1 is a block diagram of a system for detecting partial discharges in accordance with this disclosure.

With initial reference to FIG. 1, a system 100 for detecting a partial discharge from electrical equipment is now described. The system 100 includes a wearable device 105, which may be any wearable item or garment, such as a vest, shirt, pair of pants, pair of shorts, belt, sash, flash suit, jacket, bracelet, hat, or necklace. The wearable item or garment itself will be referred to here as a wearable base, and as the wearable device 105 in combination with the various components to be described below.

An antenna 110 is carried within or by the wearable base. A receiver 112 is also carried within or by the wearable base, and has an input coupled to the antenna 110. Coupled to an output of the receiver 112 is a controller 114, which is itself carried within or by the wearable base. Coupled to the controller 114 are a wireless transmitter 118, GPS receiver 120, and a set of indicator devices 116 comprised of a speaker 116a, vibration motor 116b, and LED array 116c, all of which are also carried within or by the wearable base. An input device 120 is carried within or by the wearable base and is coupled to the controller 114. A battery 130, carried within or by the wearable base, powers the various components.

The antenna 110 is flexible so as to conform to the shape of a user's body when wearing the wearable device 105. In addition, the receiver 112 may be a signal processor, signal analyzer, or sensor reader. The controller 114 may be a microcontroller, and may include any suitable sort of microprocessor or system-on-a-chip.

The wireless transmitter 118 may be a WiFi or cellular data transmitter. The input device 122 may be a switch, button, or any device adapted to receive user input. The battery 130 may be one or more rechargeable lithium batteries, although it should be appreciated that any sort of battery 130 may be used.

The speaker 116a may be a traditional speaker, or may instead be a piezoelectric speaker. The LED array 116c may include any number of LEDs of any color, such as amber, green, and red LEDs.

Although indicator devices 116 as shown include the speaker 116a, vibration motor 116b, and LED array 116c, it should be appreciated that more or less indicator devices may be used, and that each of these indicator devices is optional. In addition, it should be understood that other types of indicator devices other than those shown in FIG. 1 may be used and are within the scope of this disclosure.

The user wears the wearable device 105 while working around high voltage electrical equipment. It has been found that partial discharges result in electromagnetic emissions, particularly in the UHF band and in the ELF band (which includes frequency of the power line, such as 60 Hz or 50 Hz), at high voltages, such as above 2000 V. Therefore, in operation, the receiver 112, via the antenna 110, detects electromagnetic emissions in the appropriate frequency bands in real time. The controller 114 monitors the output from the receiver 112, and depending on factors such as the intensity, duration, and number of the electromagnetic emissions, determines whether one or more partial discharges have occurred. For example, the controller 114 may determine that a partial discharge has occurred based on the intensity of detected electromagnetic emissions exceeding a threshold value, exceeding a threshold value for a predetermined period of time, or exceeding a threshold value a predetermined number of times. Based on the intensity of the determined partial discharge or on the number of determined partial discharges, the controller 114 may determine that a full discharge is imminent.

If a full discharge is imminent, the controller 114 notifies the user via any of the indicator devices 116, so that the user knows to immediately vacate the area to avoid being injured by a full discharge if the full discharge occurs. For example, the controller 114 may sound an alarm via the speaker 116a, and/or may cause the vibration motor 116b to start generating tactile feedback that will be felt by the user, and/or may display a warning light via the LED array 116c.

The controller 114 receives input from the input device 122 and may permit the user to silence or prevent the warning issued of the imminent full discharge for a period of time or until the user indicates otherwise via the input device 122. The controller 114 may permit this regardless of the output from the receiver 112, or may permit this only if the output from the receiver 112 indicates fewer than a certain number of partial discharges, or if the radiofrequency emissions have an intensity less than a certain threshold, or if the radiofrequency emissions have an intensity less than a certain threshold for a certain period of time.

As explained, the LED array 116c may include multiple LEDs of different colors. The controller 114 may use an amber LED or LEDs of the LED array 116c to provide the warning of the imminent full discharge, may use a green LED or LEDs to indicate proper functioning of the wearable device 105, and may use a red LED or LEDs to indicate an error with the wearable device 105, such as a detected low battery 130 condition.

The controller 114 may transmit information about the detected partial discharges or about the imminent full discharge, via the wireless transmitter 118, to a monitoring station 140, either directly, or over a local area network, or over a wide area network such as the Internet. This information may be the data received from the receiver 112, or may be a processed version of that data. These transmissions may occur in real time as the partial discharges are detected, may occur periodically, or may occur when the information indicates a certain condition (such as an imminent full discharge). In addition, the controller 114 may determine a location of the wearable device 105 (and thus, of the user wearing the wearable device) via the GPS receiver 120, and transmit this location to the monitoring station 140 together with the information about the detected partial discharges.

The monitoring station 140 may record the received information about the detected partial discharges and the location of the wearable device 105, and may monitor trends of the received information so as to determine when an unsafe condition in the vicinity of the wearable device 105 at the time of partial discharge detection has developed. This may help in the determination of effective maintenance schedules.

A partial discharge signal generator 150 may be used to test proper function of the partial discharge detection device 105. To that end, this partial discharge signal generator 150 generates a signal that mimics the types of partial discharges the partial discharge detection device 105 is designed to detect. If the partial discharge detection device 105 does not properly detect the mimicked partial discharges, then a technician knows that the partial discharge detection device 105 is not properly functioning, and to service the partial discharge detection device properly.

Figure 2A:
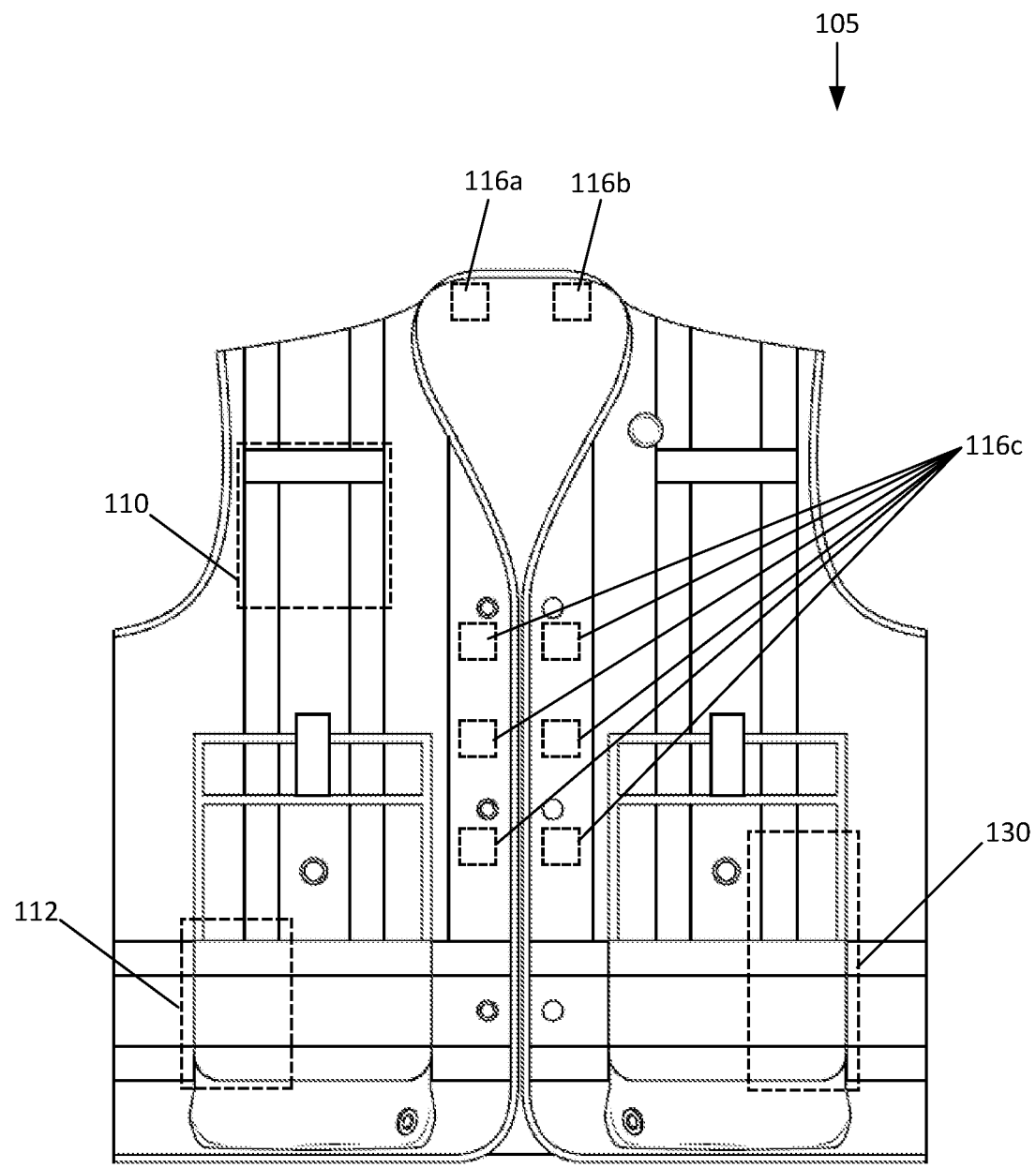
FIG. 2A is a front isometric view of a vest having the wearable partial discharge detector of FIG. 1 incorporated therein.
Figure 2B:
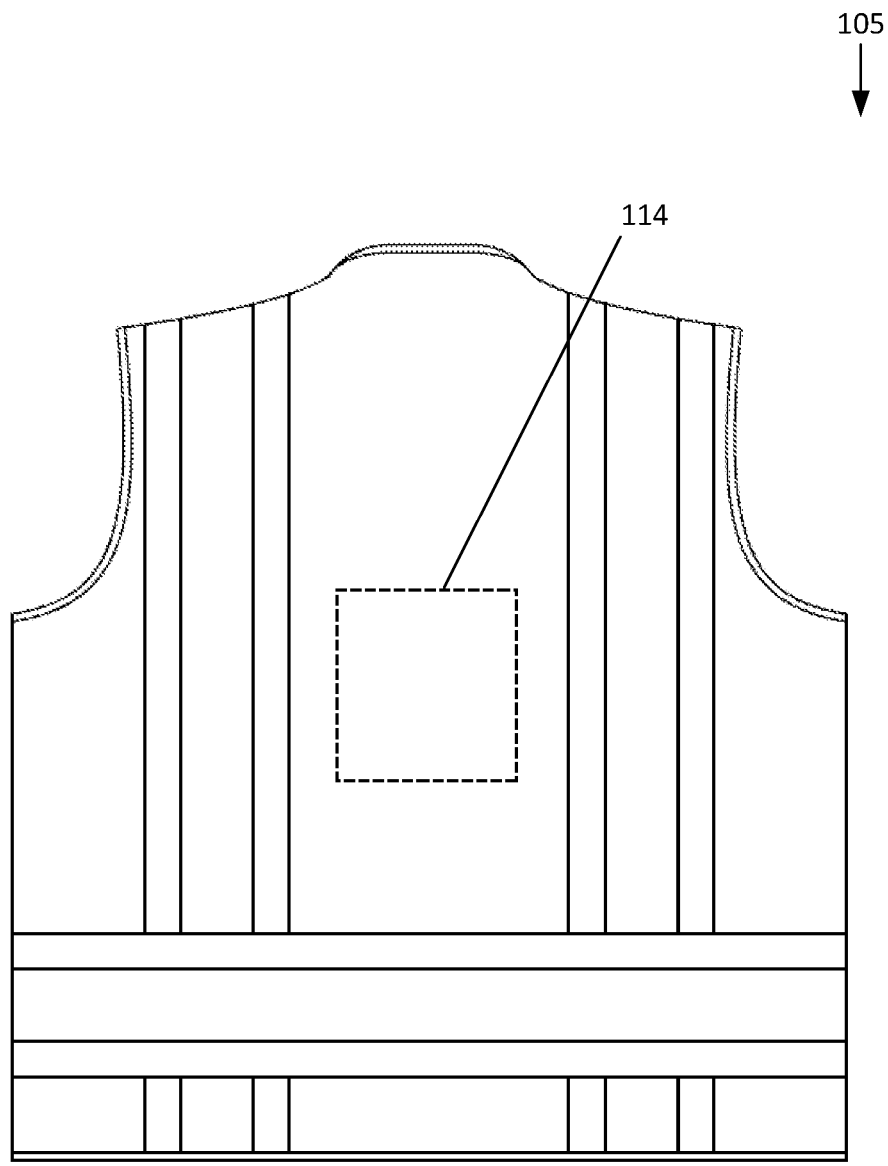
FIG. 2B is a rear isometric view of a vest having the wearable partial discharge detector of FIG. 1 incorporated therein.

A sample garment incorporating the partial discharge detection device 105 is now described with reference to FIGS. 2A-2B. The vest is sized and dimensions to fit on the torso of a human technician. The antenna 110 is contained within a pocket or internal compartment of the vest, and in FIG. 2A is illustratively contained on a side of the vest that fits adjacent a technician's right arm. The receiver 112 is contained within a pocket or internal compartment of the vest, and in FIG. 2A is illustratively contained on a side of the vest that fits adjacent a technician's right leg.

The controller 114 (shown in FIG. 2B) is contained within a pocket or internal compartment of the vest, and is illustratively contained on the portion of the vest that fits adjacent a technician's upper back. The battery 130 is contained within a pocket or internal component of the vest, and is illustratively contained on a side of the vest that fits adjacent a technician's left leg. The LED array 116c is illustratively shown disposed on either side of the front center of the best. Portions of the electronics associated with the LED array 116c may be contained within a pocket or internal component of the vest.

Contained within a pocket or internal compartment of the collar of the vest are the speaker 116a and vibration motor 116b. This placement in or about the collar allows the speaker 116a to be close to the technicians ears such that the technician can better hear an alarm sounded by the speaker 116a. Similarly, the placement in or about the collar allows the vibration motor 116b to generate vibrations close to the sensitive skin of the technician's neck such that the technician can better feel a warning issued by the vibration motor 116b.

Figure 3:
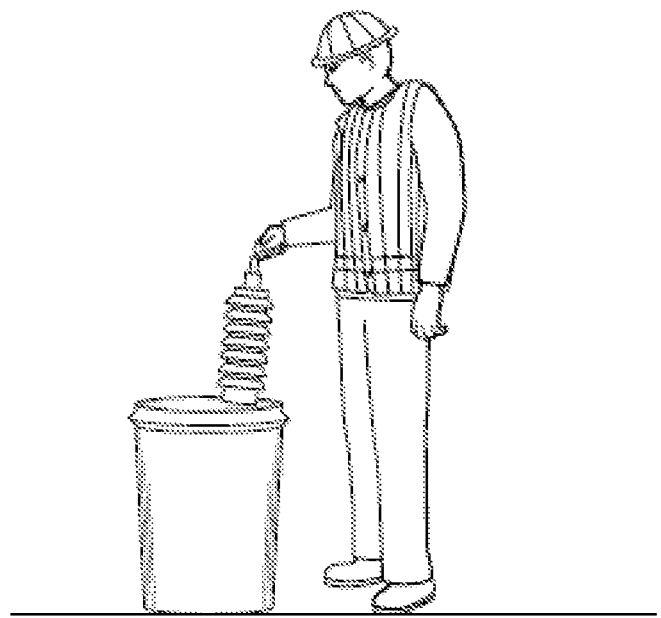
FIGS. 3-6 are a series of drawing figures depicting a technician wearing a vest having the partial discharge detector of FIG. 1 incorporated therein working around high voltage electrical equipment, being warned of an imminent full discharge by the vest, swiftly retreating to safety, and then of an unsafe condition around the electrical equipment resulting from the full discharge.

Shown in FIG. 3 is a sample scenario where a technician wearing a vest including the partial discharge detection device 105 is working around a piece of high voltage electrical equipment. In this figure, the vest is not warning the technician of an imminent full discharge, and thus the technician may proceed with his work.

Figure 4:
Figure 5:
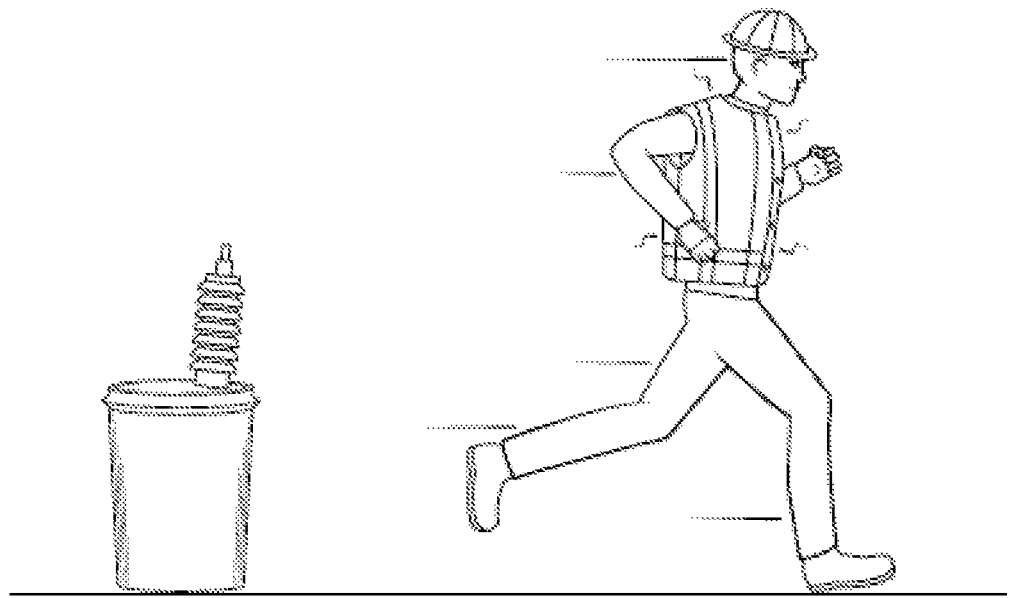
Figure 6:
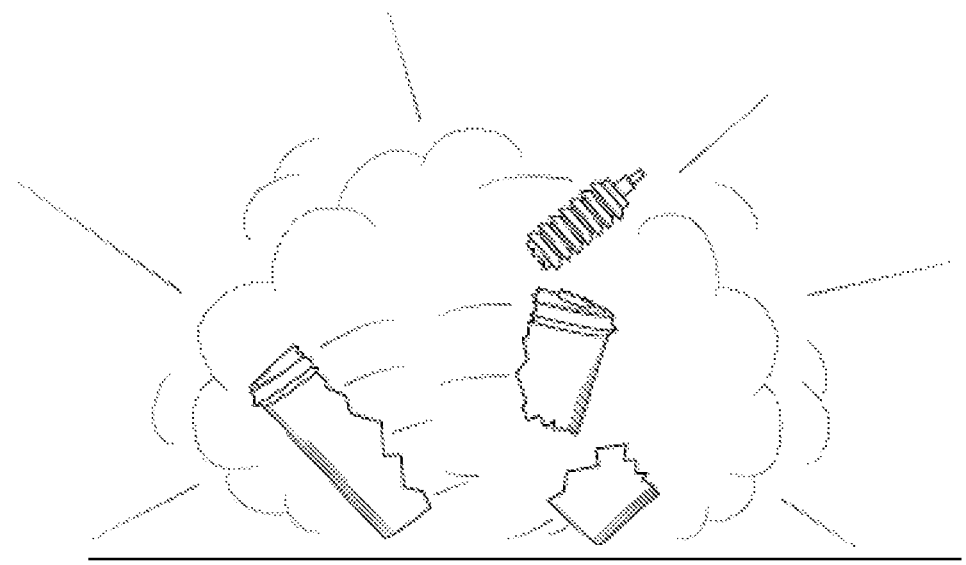

However, in FIG. 4 the partial discharge detection device 105 has detected an imminent full discharge and has warned the technician, who recognizes the danger. Then, in FIG. 5, the technician is able to escape from the vicinity of the electrical equipment, so as to thereby avoid injury resulting from the full discharge in FIG. 6, which has destroyed the electrical equipment.

Although the preceding description has been described herein with reference to particular means, materials and embodiments, it is not intended to be limited to the particulars disclosed herein; rather, it extends to all functionally equivalent structures, methods, and uses, such as are within the scope of the appended claims.

The invention claimed is:

1. A wearable device for detecting a partial discharge from electrical equipment comprising:
   a wearable base for wearing on a human body;
   an antenna carried by the wearable base;
   a receiver coupled to the antenna and carried by the wearable base;
   at least one indicator device carried by the wearable base;
   a circuitry carried by the wearable base, coupled to the antenna, receiver, and at least one indicator device, and configured to:

monitor ambient ultra high frequency (UHF) radiofrequency energy in real time and ambient extremely low frequency (ELF) radiofrequency energy;
determine that the partial discharge has occurred as a function of the ambient UHF radiofrequency energy and the ambient ELF radiofrequency energy; and
actuate the at least one indicator device as a function of the determination that the partial discharge has occurred.

2. The wearable device of claim 1, wherein the circuitry is configured to determine that the partial discharge has occurred based on the ambient radiofrequency energy exceeding a predetermined threshold.

3. The wearable device of claim 1, wherein the circuitry is configured to determine that the partial discharge has occurred based on the ambient radiofrequency energy exceeding a predetermined threshold for a predetermined period of time.

4. The wearable device of claim 1, wherein the at least one indicator device comprises at least one of a vibration motor, a speaker, an alarm, a piezoelectric speaker, and a light emitting diode array.

5. The wearable device of claim 1, further comprising at least one input device carried by the wearable base; and wherein the circuitry is further configured to deactivate the at least one indicator device based on the at least one input device.

6. The wearable device of claim 5, wherein the circuitry is configured to deactuate the at least one indictor device for a predetermined period of time based on the at least one input device.

7. The wearable device of claim 1, wherein the circuitry comprises:
a signal processing unit coupled to the antenna and configured to generate a RF signal output as a function of the ambient radiofrequency energy; and
a controller coupled to the output of the signal processing unit and configured to:
determine whether the partial discharge has occurred as a function of the RF signal output; and
actuate the at least one indictor as a function of the determination that the partial discharge has occurred.

8. The wearable device of claim 1, further comprising a wireless transmitter carried by the wearable base and coupled to the circuitry; and wherein the circuitry is configured to transmit the determination that the partial charge has occurred to a control station via the wireless transmitter.

9. The wearable device of claim 8, further comprising a global positioning satellite receiver carried by the wearable base and coupled to the circuitry; and wherein the circuitry is configured to transmit a location of the global positioning satellite receiver when the determination that the partial charge has occurred to the control station via the wireless transmitter.

10. The wearable device of claim 1, wherein the circuitry is configured to monitor ambient ultra high frequency (UHF) radiofrequency energy in real time and to determine that the partial discharge has occurred as a function of the ambient UHF radiofrequency energy.

11. The wearable device of claim 1, wherein the circuitry is configured to count a number of partial discharges that have occurred as a function of the ambient radiofrequency energy and configured to actuate the at least one indicator device as a function of the number of partial discharges that have occurred.

12. The wearable device of claim 1, wherein the wearable base comprises a lower body garment.

13. The wearable device of claim 1, wherein the garment is dimensioned to be wearable on a lower body of the human body.

14. The wearable device of claim 1, wherein the garment comprises a belt, a bracelet, a hat, a necklace, a sash, or a wristband.

15. A system for detecting a partial discharge from electrical equipment comprising:
a vest dimensioned for wear by a user;
an antenna associated with the vest;
a receiver coupled to the antenna and associated with the vest;
a wireless transmitter associated with the vest;
at least one indicator device associated with the vest, wherein the at least one indicator device comprises at least one of a vibration motor, and a light emitting diode array;
a circuitry associated with the vest, coupled to the receiver, and configured to:
monitor ambient ultra high frequency (UHF) radiofrequency energy in real time and ambient extremely low frequency (ELF) radiofrequency energy in real time;
determine that the partial discharge has occurred as a function of the ambient UHF radiofrequency energy and the ambient ELF radiofrequency energy; and
actuate the at least one indicator device as a function of the determination that the partial discharge has occurred;
transmit the determination that the partial charge has occurred to a control station via the wireless transmitter.

16. The system of claim 15, wherein the control station comprises a server coupled to a network.

17. The system of claim 15, wherein the vest has a collar; and wherein the at least one indicator device comprises a vibration motor positioned adjacent the collar such that the user can feel vibration from the vibration motor.

18. The system of claim 15, wherein the vest has a collar; and wherein the at least one indicator device comprises a sound generation unit positioned adjacent the collar such that the user can hear sound generated by the sound generation unit.

19. The system of claim 15, wherein the vest has a proximal portion to be worn adjacent a head of the user, and a distal portion to be worn adjacent a waistline of the user; and wherein the at least one indicator device comprises a light emitting diode array positioned adjacent the distal portion of the vest such that the user can see light emitted by the light emitting diode array.

20. The system of claim 15, wherein the vest has at least one internal compartment defined therein; and wherein at least one of the receiver, at least one indicator device, and circuitry are disposed within the at least one internal compartment.

21. The system of claim 15, wherein the vest has at least one pocket defined therein; and wherein at least one of the receiver, at least one indicator device, and circuitry are disposed within the at least one pocket.

22. A system for detecting a partial discharge from electrical equipment comprising:
a wearable device for wearing on a human body comprising:
a wearable base, wherein the wearable base comprises a belt, a bracelet, a garment dimensioned to be wearable on a lower body of a human body, a hat, a necklace, a pair of pants, a pair of shorts, a sash, or a wristband;
an antenna carried by the wearable base;
a receiver coupled to the antenna and carried by the wearable base;
a wireless transmitter carried by the wearable base;
at least one indicator device carried by the wearable base;
a circuitry carried by the wearable base, coupled to the receiver, wireless transmitter, and at least one indicator, and configured to:
   monitor ambient ultra high frequency (UHF) radiofrequency energy in real time and ambient extremely low frequency (ELF) in real time;
   determine that the partial discharge has occurred as a function of the ambient UHF radiofrequency energy and the ambient ELF radiofrequency energy;
   actuate the at least one indicator device as a function of the determination that the partial discharge has occurred; and
   transmit the determination that the partial charge has occurred via the wireless transmitter;
a control station configured to receive the determination that the partial discharge has occurred and to perform at least one function based thereupon.

23. The system of claim 22, wherein the at least one function comprises storing the determination that the partial discharge has occurred or presenting output to a user that the partial discharge has occurred.

* * * * *